United States Patent [19]

Saito et al.

[11] Patent Number: 5,019,995
[45] Date of Patent: May 28, 1991

[54] INPUT SIGNAL DISCRIMINATION METHOD

[75] Inventors: Yoshiyuki Saito, Minamitsuru; Junichi Sato, Hachioji, both of Japan

[73] Assignee: Fanuc Ltd., Minamitsuru, Japan

[21] Appl. No.: 332,456

[22] PCT Filed: Aug. 10, 1988

[86] PCT No.: PCT/JP88/00791
§ 371 Date: Mar. 20, 1989
§ 102(e) Date: Mar. 20, 1989

[87] PCT Pub. No.: WO89/01633
PCT Pub. Date: Feb. 23, 1989

[30] Foreign Application Priority Data

Aug. 19, 1987 [JP] Japan ................. 62-206105

[51] Int. Cl.⁵ .................. H03K 5/22; G06F 15/20
[52] U.S. Cl. .................... 364/483; 307/231; 324/76 R; 364/487
[58] Field of Search .......... 364/480, 481, 483, 487; 307/231, 356, 517, 518, 311; 377/1, 15, 32, 39; 324/76 R, 102, 119, 96

[56] References Cited

U.S. PATENT DOCUMENTS 4,054,834 10/1977 Boirat et al. .................. 324/96
4,063,121 12/1977 Bartlett ........................ 307/311
4,208,627 6/1980 Ebert, Jr. ..................... 324/102
4,475,086 10/1984 Allen .......................... 377/39

FOREIGN PATENT DOCUMENTS 50-62735 5/1975 Japan .
50-122285 9/1975 Japan .
53-3636 1/1978 Japan .
54-83866 7/1979 Japan .

Primary Examiner—Kevin J. Teska
Attorney, Agent, or Firm—Staas & Halsey

[57] ABSTRACT

An input signal discrimination method is provided wherein the on/off state of an AC input signal is discriminated.

An AC input signal (1) is input to a processor (21) through a photocoupler (13). The processor (21) counts pulses in a time for which the AC input signal (1) remains above a predetermined threshold level, and a time for which the signal remains below the predetermined threshold level. When the number of pulses counted while the signal remains above the predetermined threshold level is larger than a previously calculated number, it is decided that the AC input signal is on, and when the number of pulses counted while the signal remains below the predetermined threshold level is larger than a previously calculated value, it is decided that the AC input signal is off. Consequently, the on/off state of the AC input signal can be accurately discriminated in a short period of time.

3 Claims, 4 Drawing Sheets

INPUT SIGNAL DISCRIMINATION METHOD

DESCRIPTION

1. Technical Field

The present invention relates to an input signal discrimination method for discriminating an AC input signal by a PLC (programmable logic controller) or the like, and more particularly to an input signal discrimination method for discriminating the state of an AC input signal by counting pulses.

2. Background Art

FIG. 4 shows an input circuit conventionally used to discriminate an AC input signal by a PLC or the like. In the FIG., 1 represents an AC input signal, 10 represents an input circuit, and 20 represents a PLC for processing the input signal.

The input circuit 10 includes a rectifier circuit 11 for carrying out a full-wave rectification of the input signal, a resistor R and a capacitor C for smoothing the signal, and a photocoupler 12 to which the smoothed signal is supplied, to thereby separate a DC output from the AC input signal 1. A resistor R1, in cooperation with the resistor R, divides the voltage of the AC input signal 1 to lower the output level. The PLC discriminates the state, and carries out a sequence processing, of the AC input signal 1, based on the signal from the photocoupler 12.

With this circuit configuration, however, the output of the input circuit 10 must be a ripple-free signal, and therefore, the time constant R1·C of the circuit must be large. As a result, the response time of the input circuit 10 is prolonged and it is difficult to obtain a value shorter than three cycles of the alternating current of the AC input signal.

SUMMARY OF THE INVENTION

The object of the present invention is to provide an input signal discrimination method which solves the above-mentioned problem and in which the state of an AC input signal is discriminated by counting pulses.

To solve the above problem, the present invention provides an input signal discrimination method of discriminating an AC input signal. The method includes a step of carrying out a pulse count in a time for which the AC input signal remains above a predetermined threshold level and a time for which the AC input signal remains below the predetermined threshold level. Another step includes deciding that the AC input signal is on by counting the number of pulses the AC input signal remains above the predetermined threshold level and determines that the number of pulses counted is larger than a previously calculated number of pulses. The method also includes deciding that the AC input signal is off when the number of pulses counted while the AC input signal remains below the predetermined threshold level is larger than the previously calculated number of pulses.

When the AC input signal is on, the signal level remains higher than the threshold level for a predetermined time, and therefore, this high-level time is discriminated by the number of pulses counted to discriminate the signal on state.

Alternatively, when the AC input signal is off, the signal level remains lower than the threshold level for a predetermined time, and therefore, this low-level time is discriminated by the number of pulses counted to discriminate the signal off state.

DESCRIPTION OF THE PREFERRED EMBODIMENT

An embodiment of the present invention will be described with reference to the drawings.

Figure 1:
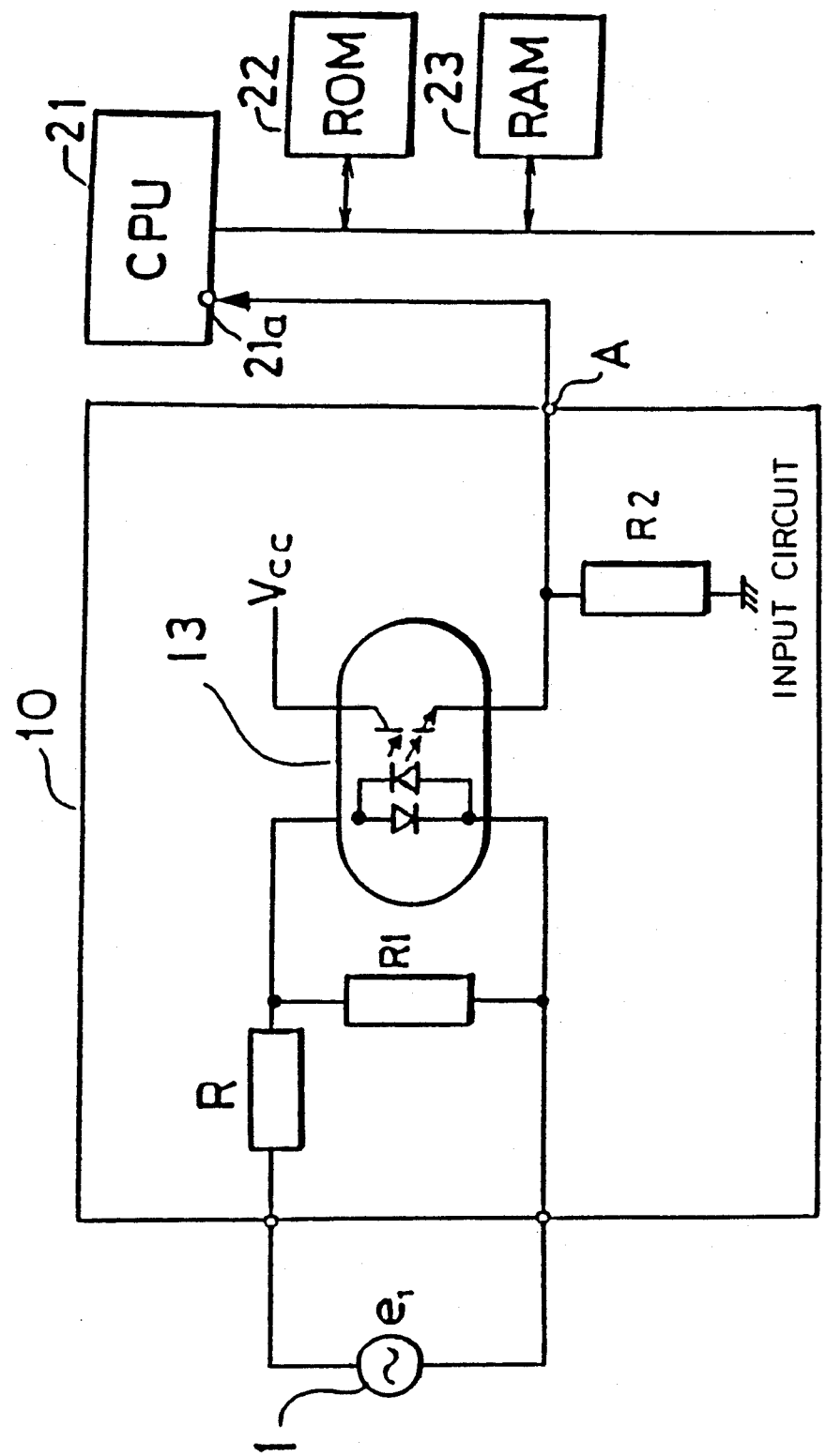
FIG. 1 is a block diagram illustrating an embodiment of the present invention.

FIG. 1 is a block diagram illustrating an embodiment of the present invention. In the FIG., 1 denotes an AC input signal, the on or off state of which is determined by the effective value thereof, and 10 represents an input circuit which receives the AC input signal 1 and outputs a DC signal. The input circuit 10 includes resistors R and R1 which carry out a voltage division of the input signal and apply the divided voltage to a photocoupler 13. The photocoupler 13 includes light-emitting diodes connected in an inverse-parallel fashion as shown in the figure, for rectifying the AC input by turning on a transistor when a current having a level higher than the threshold level flows in either direction. Vcc designates a voltage applied to a logic circuit and is usually +5 V, and R2 denotes a voltage detection resistor. Accordingly, the input circuit outputs, from an output terminal A thereof, a signal obtained by carrying out a full-wave rectification of the AC input signal 1. Numeral 21 denotes a processor of a PLC (programmable logic controller) for global control of the PLC, 22 denotes a ROM for storing a monitor program for the PLC, a sequence program, and the like, and 23 denotes a RAM for storing various data and a signal output from the input circuit 10 through the processor 21.

The output of the input circuit 10, which is connected to an input port of the processor 21, is read by the processor 21 in a cycle shorter than one cycle of the AC input signal 1. When the AC input signal 1 is on, the output level of the input circuit 10 remains higher than the threshold level for longer than a predetermined time, and accordingly, the signal on time is prolonged. When the AC input signal is off, the time for which the output level remains below the threshold level is prolonged, and therefore, this time is counted by the processor to discriminate the state of the AC input signal.

Figure 2:
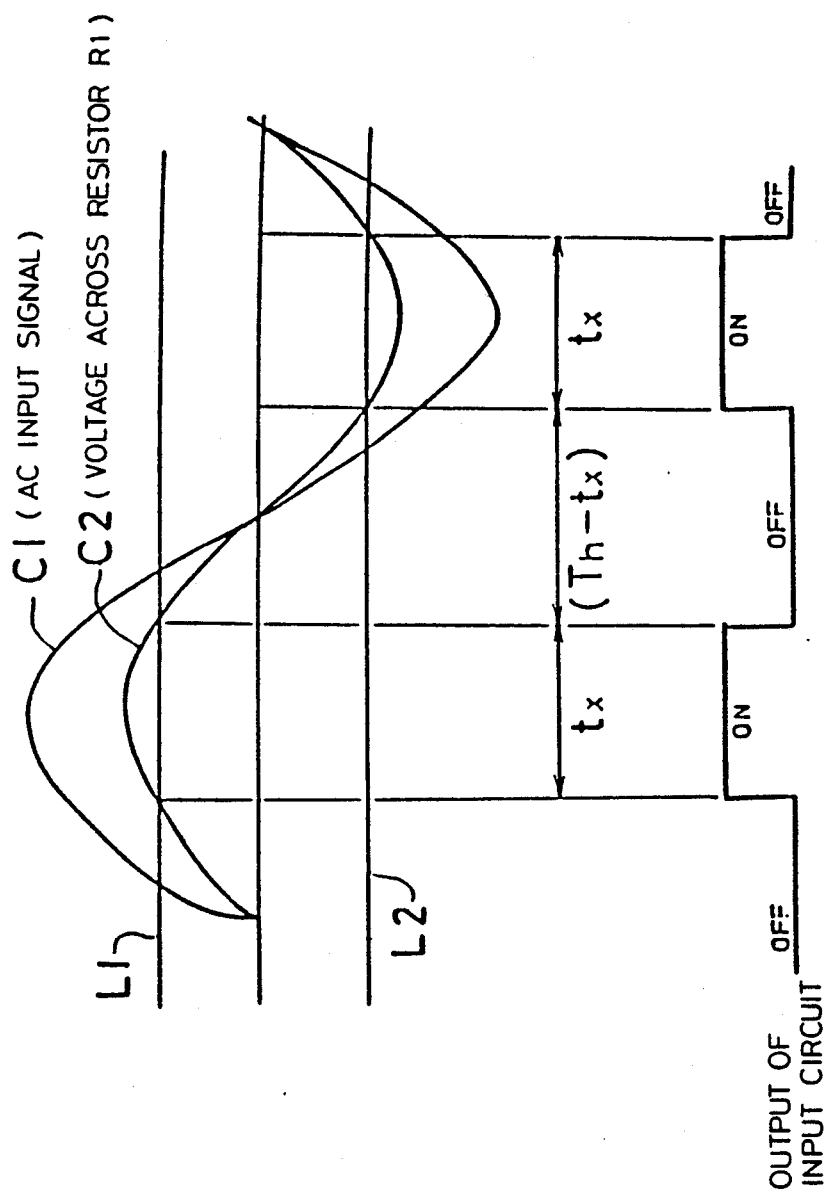
FIG. 2 is a timing chart for illustrating the embodiment of the invention.

FIG. 2 is a timing chart illustrating the embodiment of the invention. In the figure, C1 represents the AC input signal 1 in FIG. 1, and C2 represents the voltage across the resistor R1 the ratio of magnitude between the two is actually about 20:1 although the ratio illustrated is about 2:1. Straight lines L1 and L2 indicate the threshold levels of the photocoupler 13, OUTPUT OF INPUT CIRCUIT indicates the output waveform at terminal A of the input circuit 10 in FIG. 1, and READ CYCLE represents the timing at which the processor 21 reads the output signal of the input circuit 10.

When the AC input signal 1 is on, the voltage C2 across the resistor R1 exceeds and remains higher than the threshold level for longer than a predetermined time. Accordingly, if the input signal is read by the processor 21 in the above-mentioned read cycle, the on state continues for longer than a predetermined time, and as a result, the processor 21 decides that the input signal is on.

When the AC input signal 1 is off, the voltage across the resistor R1 is below the threshold level, or if higher than the threshold level, the time for which the voltage remains above the threshold level is shorter than a predetermined time. Therefore, the off time of the output signal of the input circuit is prolonged, and when the signal is read by the processor 21 in the read cycle mentioned above, the off state continues for longer than a predetermined time, and as a result, the processor decides that the input signal is off.

Referring to FIG. 2, assuming that the curve C2 represents the boundary between the signal on and off states, then $$ts = (1/N) \cdot tx = (1/n) \cdot Th$$

stands, wherein
ts: the interval of the read cycle of the processor;
N: the time for which the on state of the AC input signal continues;
Th: the half cycle of the AC input signal;
n: the number of read cycles during one half cycle of the AC input signal.

Namely, when the input signal remains on for longer than a time N, the processor decides that the AC input signal 1 is on. Alternatively, when the input signal remains off for longer than a time $(n-N+1)$, then it is determined that the AC input signal is off.

Accordingly, the processor 21 can discriminate the state of the AC input signal within the time $(Th+tx)$, and thus the response time can be shortened.

Figure 3:
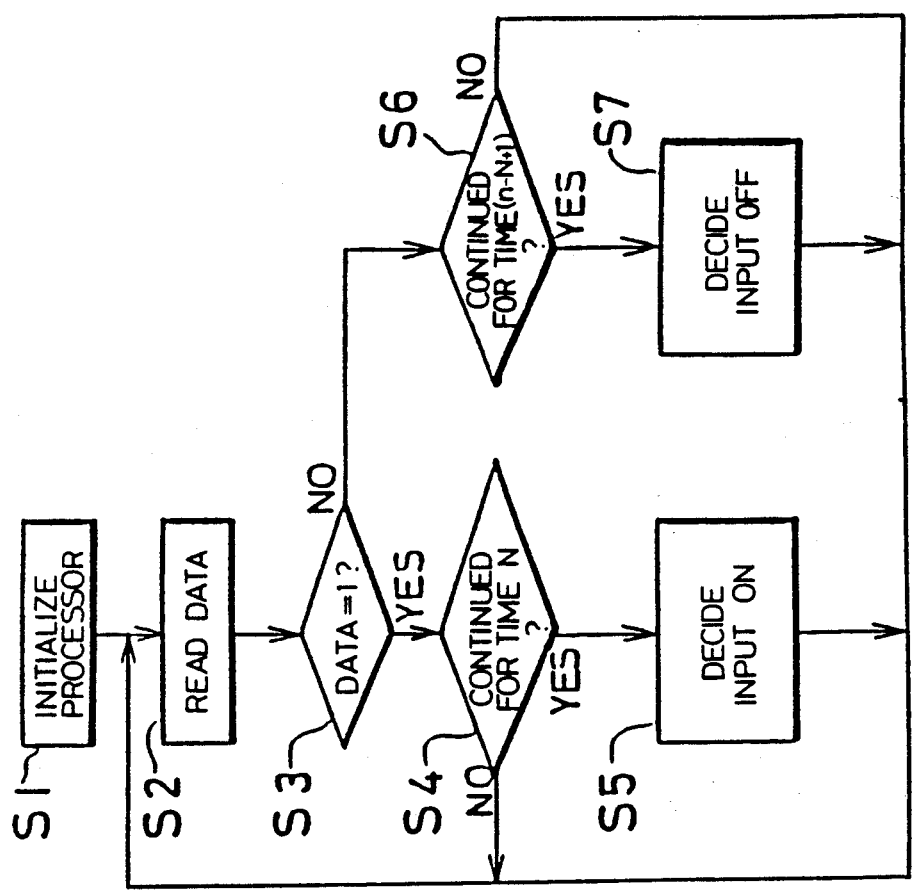
FIG. 3 is a flowchart illustrating the embodiment of the invention.
Figure 4:
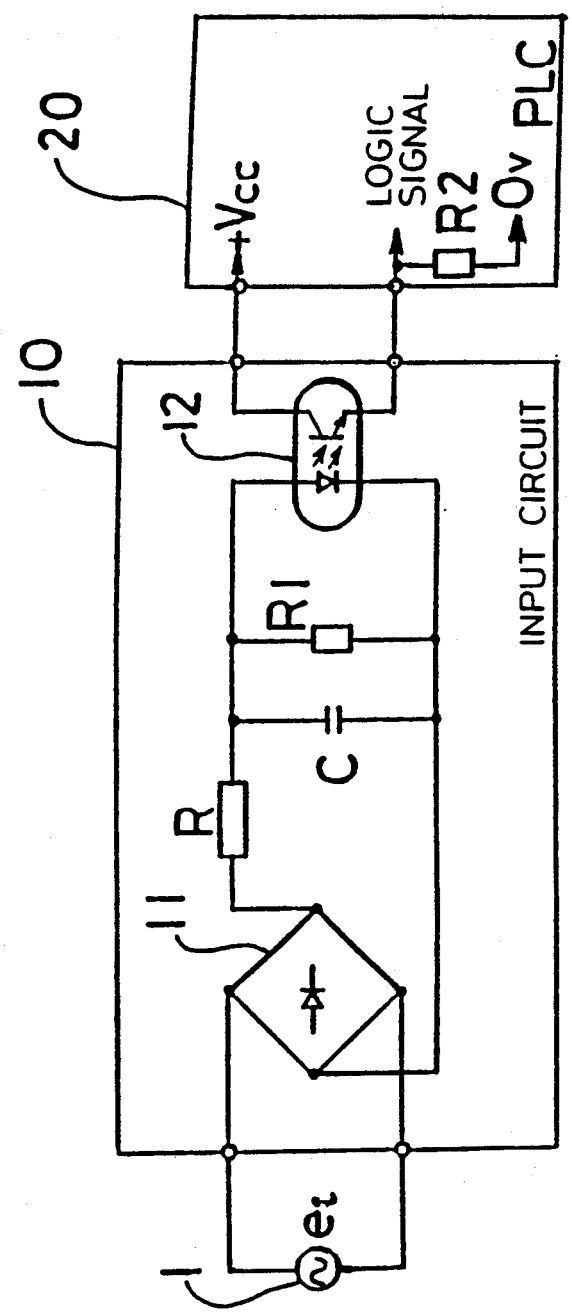
FIG. 4 is a diagram showing an example of conventional prior art input circuit.

FIG. 3 is a flowchart illustrating the embodiment of the invention. The number following the letter "S" indicates the number of the step.

[S1] The processor is initialized.
[S2] The signal input from the input circuit 10 is read.
[S3] It is determined whether the input signal is on or off. When the signal is on, the program proceeds to S4, and when the signal is off, the program proceeds to S6.
[S4] It is determined whether the on state of the input signal is continued for a time N. If yes, it is decided at S5 that the AC input signal 1 is on, and if no, as the state of the signal has not changed, the flow returns to S2.
[S6] Since the input signal is off, it is determined whether the off state is continued for a time $(n-N+1)$. If yes, at S7 it is decided that the AC input signal 1 is off, and if no, as the state of the signal has not changed, the flow returns to S2.

Accordingly, the input signal from the input circuit 10 is read in a cycle ts, and the state of the AC input signal 1 is discriminated.

In the foregoing description, the photocoupler has light-emitting diodes connected in parallel and having opposite polarities, alternatively, a photocoupler including a single light-emitting diode may be used with the addition of a rectifier circuit provided before stage resistor R, thus forming a similar circuitry.

Moreover, the signal from the input circuit may be connected to the input port of the processor through a bus. Such a construction is particularly practical when the number of input signals is large, because the number of input ports is relatively small.

As described above, the construction of the present invention is such that the state of the AC input signal is discriminated by counting pulses, and accordingly, the response time is shortened and components such as a capacitor or the like can be omitted.

We claim:

1. An input signal discrimination method of discriminating an AC input signal, said method comprising the steps of:
   a) carrying out a pulse count during a time in which the AC input signal remains above a predetermined threshold level and during a time in which the AC input signal remains below the predetermined threshold level;
   b) deciding that the AC input signal is ON when the number of pulses counted while the AC input signal remains above the predetermined threshold level is large than a previously calculated number of pulses; and
   c) deciding that the AC input signal is OFF when the number of pulses counted while the AC input signal remains below the predetermined threshold level is larger than the previously calculated number of pulses.

2. An input signal discrimination method according to claim 1, further comprising the step of separating the AC input signal from a discrimination circuit by a photocoupler.

3. An input signal discrimination method according to claim 2, wherein said step of separating the AC input signal is accomplished by providing the photocoupler with light-emitting diodes connected in parallel and having opposite polarities.

* * * * *